United States Patent
Malich et al.

(10) Patent No.: US 8,922,149 B2
(45) Date of Patent: Dec. 30, 2014

(54) METHOD AND DEVICE FOR DETECTING BLOCKING OR SLUGGISHNESS OF A DC MOTOR

(75) Inventors: Thomas Malich, Kappelrodeck (DE); Volker Lurk, Offenburg (DE); Gerald Roos, Achern (DE); Nikolas Haberl, Sinzheim (DE); Frank Fischer, Buehl (DE); Christian Poddey, Oetigheim (DE); Michael Koerner, Buehl (DE); Jan Van Goethem, Gambsheim (DE); Daniel Hofacker, Achern (DE); Tobias Stiefel, Baden-Baden (DE)

(73) Assignee: Robert Bosch GmbH, Stuttgart (DE)

( * ) Notice: Subject to any disclaimer, the term of this patent is extended or adjusted under 35 U.S.C. 154(b) by 136 days.

(21) Appl. No.: 13/634,827

(22) PCT Filed: Jan. 25, 2011

(86) PCT No.: PCT/EP2011/050995
§ 371 (c)(1),
(2), (4) Date: Nov. 20, 2012

(87) PCT Pub. No.: WO2011/113636
PCT Pub. Date: Sep. 22, 2011

(65) Prior Publication Data
US 2013/0057187 A1    Mar. 7, 2013

(30) Foreign Application Priority Data
Mar. 17, 2010   (DE) .................. 10 2010 002 946

(51) Int. Cl.
*H02P 7/06*       (2006.01)
*H02P 29/02*      (2006.01)
*G01R 31/34*      (2006.01)

(52) U.S. Cl.
CPC ............ *G01R 31/343* (2013.01); *H02P 29/021* (2013.01); *H02P 29/028* (2013.01); *Y10S 388/903* (2013.01)
USPC ............ 318/434; 388/809; 388/816; 388/903

(58) Field of Classification Search
CPC ..... H02P 27/08; H02P 21/0035; H02P 25/14; H02P 29/02; H02P 6/185; H02P 2203/09
USPC .......... 318/430–434, 244, 245; 388/800, 809, 388/815, 816, 821, 903
See application file for complete search history.

(56) References Cited

U.S. PATENT DOCUMENTS

| 8,022,653 | B2 * | 9/2011 | Oxle et al. ................... 318/460 |
| 2007/0229011 | A1 | 10/2007 | Knab et al. |
| 2008/0303461 | A1 * | 12/2008 | Knab et al. ................... 318/278 |
| 2009/0225479 | A1 * | 9/2009 | Jayanth et al. ............... 361/30 |

FOREIGN PATENT DOCUMENTS

| DE | 102004030309 | 1/2006 |
| DE | 102006016778 | 10/2007 |

OTHER PUBLICATIONS

International Search Report for Application No. PCT/EP2011/050995 dated Jun. 8, 2011 (English Translation and Original, 6 pages).

* cited by examiner

*Primary Examiner* — Bentsu Ro
(74) *Attorney, Agent, or Firm* — Michael Best & Friedrich LLP

(57) ABSTRACT

The invention relates to a method for detecting blocking or sluggishness ($M_1$, $M_3$) of a DC motor (2). The method comprises the following steps: applying a voltage pulse ($U_{v,t}=O_s$) to the DC motor (2); monitoring a motor current ($I_{Motor}$) flowing through the DC motor (2); detecting a maximum value of the motor current ($I_{Motor}$) following the application of the voltage pulse; checking whether a change in the motor current ($I_{Motor}$) after reaching the maximum value exceeds a specific amount; signalling the blocking or the sluggishness ($M_1$, $M_3$) of the DC motor (2) if the change in the motor current ($I_{Motor}$) after reaching the maximum value exceeds the specific amount.

9 Claims, 3 Drawing Sheets

METHOD AND DEVICE FOR DETECTING BLOCKING OR SLUGGISHNESS OF A DC MOTOR

TECHNICAL FIELD

The invention relates to methods for detecting faults in the operation of a DC motor, in particular methods for detecting blocking or sluggishness of the DC motor.

BACKGROUND OF THE INVENTION

DC motors are known from the prior art. These have, for example, an armature or rotor provided with coils that are supplied with electric energy via a commutator with a brush arrangement. When a fault occurs, it is possible owing to jamming of the rotor, for example because of loose components in the interior of the DC motor, on the one hand, or, on the other hand, owing to a fault in the downstream system driven by the DC motor for the rotor to be blocked and thereby, possibly, for this to lead to damage or destruction of the drive electronics and of the DC motor by overheating if the DC motor continues to be powered. Consequently, an attempt is usually made to detect blocking of the DC motor at an early stage in order to interrupt the current flow through the DC motor when blocking is detected.

The blocking of a DC motor is usually carried out on the basis of speed monitoring in which a speed sensor is used to detect a profile of the speed. If, despite powering of the DC motor, no movement of the rotor is detected, it is possible to infer blocking of the motor. However, this method assumes that a speed sensor has been provided. This is expensive, and it is desirable to save the additional component of a speed sensor.

In modern motor systems, an attempt is therefore made to carry out speed detection without sensors, solely on the basis of an evaluation of a current profile through the DC motor. It is possible for this purpose to monitor a motor current, it being assumed that the blocked DC motor has a substantially higher current consumption than would be the case for a DC motor under load functioning correctly.

However, given increased wear of the DC motor, for example given pasting, given jamming of brushes on the commutator lamellae, given wear of the brush electrodes, and the like, it is possible for states to occur in which even a blocked DC motor does not occasion such a substantially increased motor current that said motor can be detected as blocked with the aid of the above method of current monitoring.

It is therefore desirable to make available a method and a device for detecting blocking or sluggishness of a DC motor in the case of which blocking can be reliably detected even when there is no substantially increased motor current given a motor that is blocked because of an age-induced degradation of components.

SUMMARY OF THE INVENTION

This object is achieved by a method for detecting blocking or sluggishness of a DC motor and by a device and a motor system.

In accordance with a first aspect, a method is provided for detecting blocking or sluggishness of a DC motor. The method comprises the following steps:
applying a voltage pulse to the DC motor;
monitoring a motor current flowing through the DC motor;
setting a maximum value of the motor current after the application of the voltage pulse;
checking whether a change in the motor current exceeds a specific absolute value after reaching the maximum value; and
signaling the blocking or the sluggishness of the DC motor when the change in the motor current exceeds the specific absolute value after reaching the maximum value.

One idea of the invention consists in monitoring the profile of the motor current of the DC motor given a suddenly connected voltage, in particular a supply voltage, it being detected, in particular, by what absolute value the motor current consumed by the DC motor drops after a maximum value is reached after the application of the supply voltage. If the drop after the reaching of the maximum current value is a specific absolute value dependent on the maximum current value, it is possible to infer a correct startup and absence of blocking of the DC motor.

The above method has the advantage that even in the case of DC motors having relatively severe attrition-induced wear, for example owing to pasting, owing to clamping of brush electrodes on commutator lamellae, owing to wear of the brush electrodes and the like, it is possible to reliably detect blocking of the DC motor simply by qualitative monitoring of the profile of the motor current after application of a supply voltage.

Furthermore, the maximum value of the motor current can be set after the application of the voltage pulse by storing the respective maximum value of the monitored motor current.

In accordance with one embodiment, the checking as to whether the change in the motor current exceeds the specific absolute value after reaching the maximum value can be carried out only during a prescribed period, blocking or sluggishness being detected only when the motor current exceeds the specific absolute value within the prescribed period.

It can be provided that a check is made before the application of the voltage pulse as to whether the DC motor is at standstill, the method being carried out when a standstill of the DC motor is detected.

In particular, the checking as to whether the change in the motor current exceeds the specific absolute value after reaching the maximum value can be carried out by determining from the maximum value with the aid of a multiplication by a prescribed factor that is smaller than 1 a motor current threshold value that is smaller than the maximum value.

Furthermore, the voltage pulse can be generated by applying a DC supply voltage, or by applying a clocked DC supply voltage for which the DC supply voltage is clocked in accordance with a pulse duty factor in order to generate a voltage pulse having an effective voltage determined by the pulse duty factor.

In accordance with a further aspect, a device for detecting blocking or sluggishness of a DC motor is provided. The device comprises:
a switch for applying a voltage pulse to the DC motor;
a current detector for monitoring a motor current flowing through the DC motor;
a control unit that is designed
to set a maximum value of the motor current after the application of the voltage pulse;
to check whether a change in the motor current exceeds a specific absolute value after reaching the maximum value; and
to signal the blocking or the sluggishness of the DC motor when the change in the motor current exceeds the specific absolute value after reaching the maximum value.

In accordance with a further aspect, a motor system having a DC motor and the above device for detecting the blocking or the sluggishness of the DC motor is provided.

BRIEF DESCRIPTION OF THE DRAWINGS

Embodiments of the invention are explained below in more detail with the aid of the attached drawings, in which.

DETAILED DESCRIPTION

Figure 1:
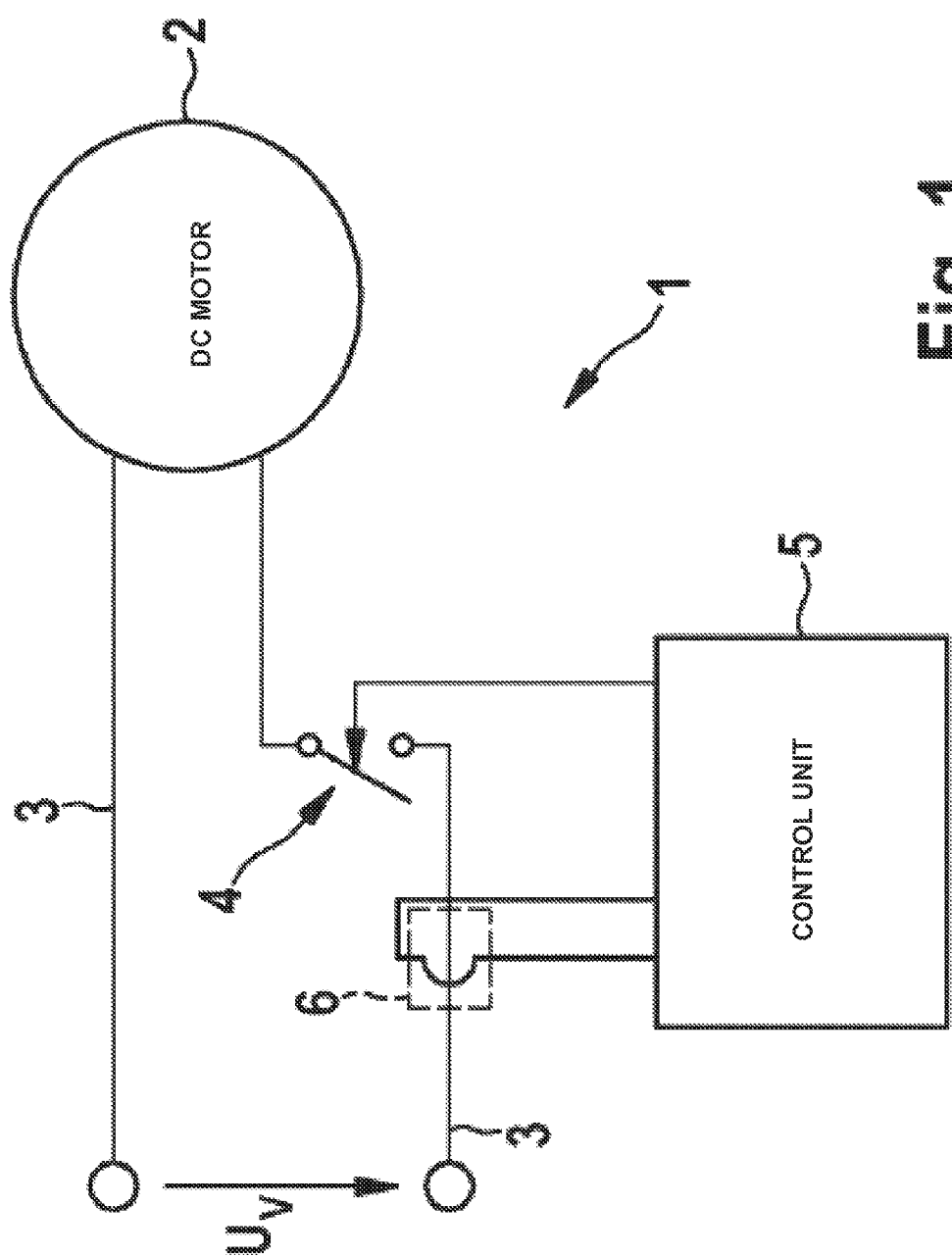
FIG. 1 is a schematic of a motor system.

FIG. 1 is a schematic of a simple motor system 1 having a DC motor 2. The DC motor 2 corresponds, preferably, to a brush-commutated DC motor 2 in which rotor coils are supplied via a commutator with electric energy in the form of a DC supply voltage $U_v$ that can be applied to the DC motor 2. The DC supply voltage $U_v$ is applied to the DC motor 2 via supply voltage lines 3, a circuit breaker 4, for example in the form of a semiconductor circuit breaker, being arranged in one of the supply voltage lines 3. The semiconductor circuit breaker is preferably embodied in the form of a MOSFET, thyristor, IGBT or the like. The motor system 1 can be, for example, a fan system in a motor vehicle. In this case, the DC supply voltage $U_v$ is provided by a vehicle battery (not shown).

A control unit 5 is provided that drives the circuit breaker 4. In order to drive the DC motor 2 with a variable power, the control unit 5 can drive the circuit breaker 4 in accordance with pulse width modulation using a specific pulse duty factor that, given cyclic driving of the circuit breaker 4, specifies the ratio of an on time to a period of the cyclic drive. In order to monitor the motor current that flows through the DC motor 2 as it operates, a current detector 6 is provided that is designed as a measurement resistor or, as illustrated schematically in FIG. 1, as an inductively coupled element. Alternatively, the current can also be realized with a so-called sense FET. A sense FET comprises a current mirror circuit in the case of which current to be measured is coupled in reduced fashion into a measuring circuit and is measured there with the aid of a measurement resistor. Depending on the motor current flowing through the relevant supply voltage line 3, a measurement voltage that is fed to the control unit 5 is provided. The control unit 5 uses the detected measurement voltage to determine the motor current flowing through the supply voltage line 3.

Figure 2:
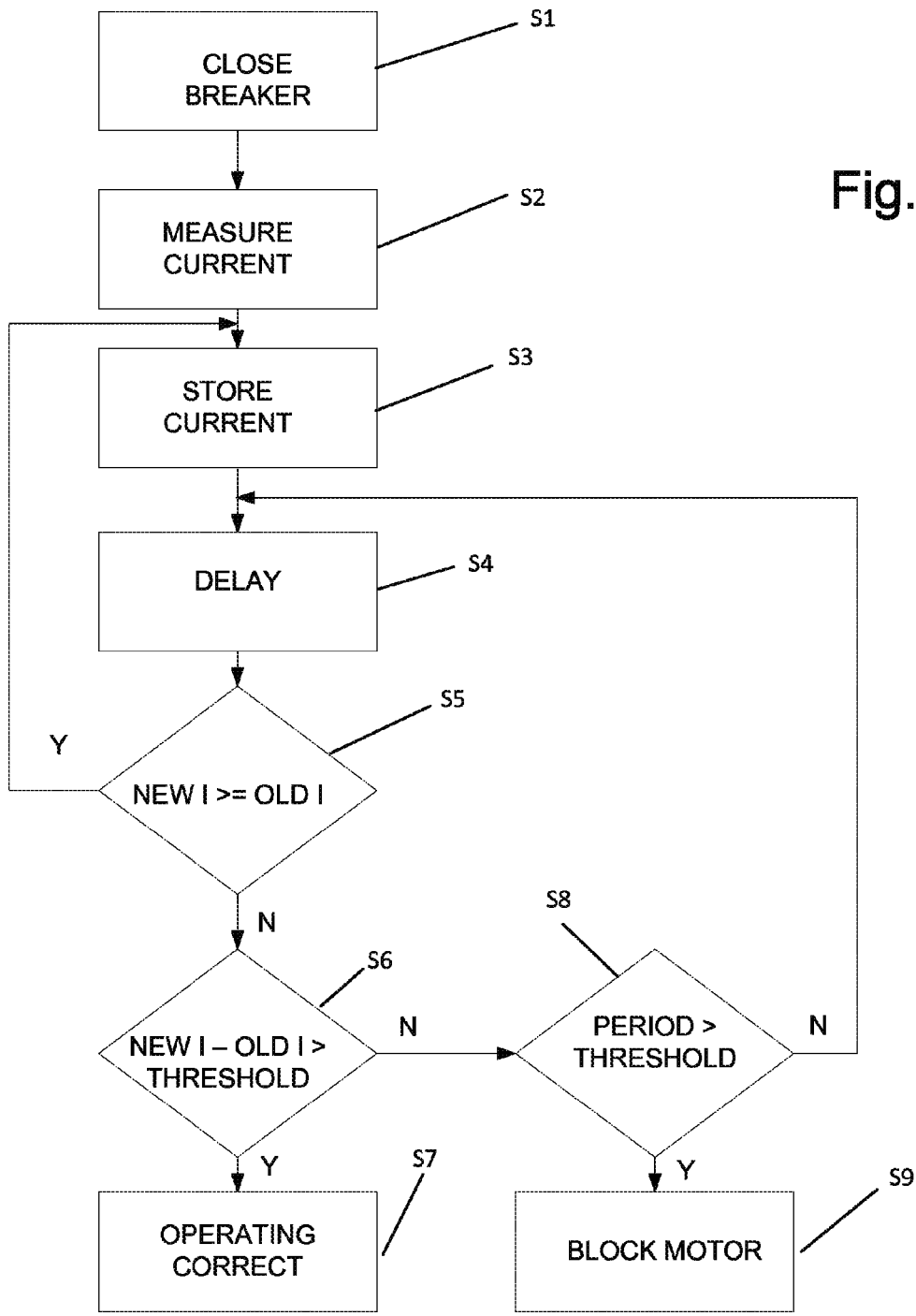
FIG. 2 shows a flowchart for illustrating the method for detecting a case of blocking of a DC motor.

FIG. 2 shows a flowchart for explaining a method with the aid of which blocking or sluggishness of the DC motor 2 can be detected. For this purpose, in a step S1 the circuit breaker 4 of an open circuit breaker 4 is first brought from an open into a closed state in order thus to suddenly apply the DC supply voltage U to the DC motor 2. Alternatively, the voltage pulse applied may be a smaller jump voltage than the supply voltage. This is achieved by virtue of the fact that in order to apply the voltage jump the supply voltage is applied in clocked fashion, for example with a frequency of several kHz and a prescribed pulse duty factor. The pulse duty factor determines the effective voltage that is applied suddenly in this way. During application of the DC supply voltage U or the jump voltage, the DC motor 2 is preferably at standstill.

Subsequently, in a step S2 the motor current $I_{Motor}$ is measured with the aid of is the current detector 6, and stored in a suitable way in a step S3. For this purpose, the measured motor current $I_{Motor}$ is preferably digitized in the control unit 5 and stored is intermediately in a register or some other storage element provided in the control unit 6.

After passage of a predetermined period, in a step S4, a renewed measurement of the motor current $I_{Motor}$ is undertaken and, after its digitization, a check is made in step S5 as to whether the newly measured motor current $I_{Motor}$ is equal to or greater than the is value of the motor current $I_{Motor}$ stored intermediately in step S3. If this is the case (Alternative: Yes), a jump back to step S3 is made, and the current value detected in step S4 is input into the appropriate storage element instead of the value previously stored.

If the value of the motor current $I_{Motor}$ measured in step S4 is smaller than the value of the motor current $I_{Motor}$ stored intermediately (Alternative: No), a check is made in step S6 as to whether the current value measured in step S4 is smaller by a specific, prescribed absolute value than the intermediately stored current value. If this is not the case (Alternative: No), a check is made in step S8 as to whether a predetermined period has elapsed. When it is detected in step S8 that a predetermined period has elapsed without it having been detected in step S6 that the last measured current value lies below the intermediately stored (maximum) current value by a predetermined absolute value (Alternative: Yes), blocking of the DC motor 2 is signaled in step S9. If it is detected in step S8 that the predetermined period has not yet expired (Alternative: No), a jump back is made to step S4 and a next value of the motor current $I_{Motor}$ is detected. is When it is detected in step S6 that the value of the motor current $I_{Motor}$ measured in step S4 is smaller than the current value stored in step S3 by the specific absolute value (Alternative: Yes), a correct operation of the DC motor 2 is detected in step S7 and it is signaled that said motor has started up on the basis of the DC supply voltage applied suddenly in step S1.

Figure 3:
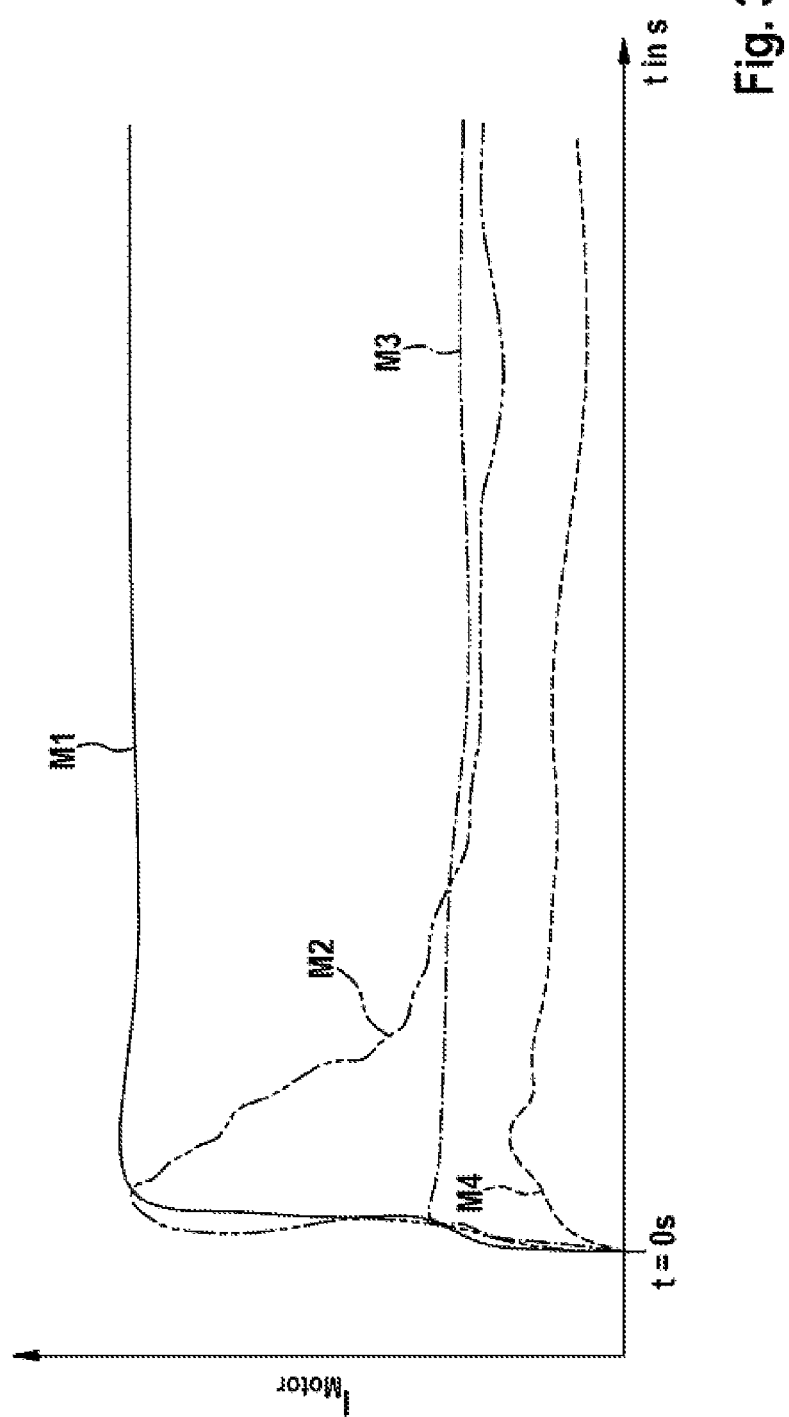
FIG. 3 shows a signal-time diagram for explaining the motor current profiles for a normal DC motor operated correctly, and in a case of blocking and equally for a DC motor with reduced current consumption.

FIG. 3 shows a signal-time diagram that illustrates the profiles of the motor current for a DC motor 2 without wear in the event of blocking (M1) and in the event of a correct startup (M2) and for a DC motor 2 with wear in the event of blocking (M3) and in the event of a correct startup (M4). In the event of a suddenly connected DC supply voltage $U_v$ at time t=0 s, for which the DC motor 2 has a speed of 0 revolutions per minute, and thus no voltage is induced by the rotation of the DC motor 2, the entire motor voltage drops without deduction over the rotor winding, and the blocking current flows into the rotor winding. Because of the motor current $I_{Motor}$, a drive torque acts to accelerate the DC motor 2 and thus to induce in a fashion proportionate to the speed an opposing voltage $U_{ind}$ that is directed counter to the supply voltage $U_v$ and effects a reduction in the motor current. Given a blocked DC motor 2, the current consumption does not, by contrast, drop, since the speed of the motor remains at 0 revolutions per minute, and so no opposing voltage can be induced. This case is detected by the abovedescribed blocking detection from the fact that the motor current $I_{Motor}$ does not drop below the previously achieved (stored) maximum current value by a specific absolute value.

Given a current consumption of the blocked DC motor 2 in the range of the rated current of the running system, detection by an overcurrent, which is carried out with conventional systems, is not suitable for detecting blocking For this case, the current consumption of the DC motor 2 is briskly taken up after the suddenly connected DC supply voltage $U_v$ and the maximum value is respectively stored. If the motor current $I_{Motor}$ drops after reaching the maximum value, blocking of the DC motor is detected whenever the drop in the motor current does not take place at a sufficient level.

The specific absolute value by which the value of the motor current must drop in the case of correct operation after reaching the maximum value in order to confirm correct operation is usually determined as a function of the previously achieved maximum value. A definition of a factor, which can be used to determine a motor current threshold value, or a relative threshold is suitable for this purpose, for example. By way of example, the factor for defining a motor current threshold value for a DC motor in the case of which the blocking current is, for example, greater by an overcurrent factor of 3 to 4 than the motor current in the case of a static operating point can be set to the reciprocal of the overcurrent value. The maximum value of the motor current is multiplied by the reciprocal of the overcurrent factor, and the result then serves as threshold with which the instantaneous value of the motor current is compared in step S5. If the measured value of the motor current does not drop below this threshold within the predetermined period, it is possible to detect a blocked DC motor 2.

In addition, before the supply voltage is connected it is possible to check whether the speed of the DC motor is at 0 revolutions per minute before the method begins, since otherwise the method for detecting blocking of the DC motor cannot be carried out reliably. Checking the instantaneous speed of the DC motor 2 can, for example, be carried out by measuring the generator voltage of the DC motor 2. If this is not equal to 0, the DC motor 2 is not at standstill.

The invention claimed is:

1. A method for detecting blocking or sluggishness of a DC motor (2), the method comprising:
    applying a voltage pulse to the DC motor (2);
    monitoring a motor current ($I_{Motor}$) flowing through the DC motor (2);
    setting a maximum value of the motor current ($I_{Motor}$) after the application of the voltage pulse;
    checking whether a change in the motor current ($I_{Motor}$) exceeds a specific absolute value after reaching the maximum value; and
    signaling the blocking or the sluggishness of the DC motor (2) when the change in the motor current ($I_{Motor}$) exceeds the specific absolute value after reaching the maximum value.

2. The method as claimed in claim 1, in which the maximum value of the motor current ($I_{Motor}$) is set after the application of the voltage pulse by storing the respective maximum value of the monitored motor current ($I_{Motor}$).

3. The method as claimed in claim 1, in which checking whether the change in the motor current ($I_{Motor}$) exceeds the specific absolute value after reaching the maximum value is carried out during a prescribed period, blocking or sluggishness being detected when the motor current ($I_{Motor}$) exceeds the specific absolute value within the prescribed period.

4. The method as claimed in one of claim 1, in which a check is made before the application of the voltage pulse as to whether the DC motor (2) is at standstill, the method carried out when a standstill of the DC motor (2) is detected.

5. The method as claimed in claim 1, in which the checking as to whether the change in the motor current exceeds the specific absolute value after reaching the maximum value is carried out by determining from the maximum value with the aid of a multiplication by a prescribed factor that is smaller than 1 a motor current threshold value that is smaller than the maximum value.

6. The method as claimed claim 1, in which the voltage pulse is generated by applying a DC supply voltage, in order to generate a voltage pulse having an effective voltage determined by a pulse duty factor.

7. The method as claimed in claim 6, in which the DC supply voltage, is a clocked DC supply voltage for which the DC supply voltage is clocked in accordance with the pulse duty factor.

8. A device for detecting blocking or sluggishness of a DC motor (2), comprising:
    a switch for applying a voltage pulse to the DC motor (2);
    a current detector (6) for monitoring a motor current ($I_{Motor}$) flowing through the DC motor (2);
    a control unit (5) that is designed to set a maximum value of the motor current ($I_{Motor}$) after the application of the voltage pulse; to check whether a change in the motor current ($I_{Motor}$) exceeds a specific absolute value after reaching the maximum value; and
    to signal the blocking or the sluggishness of the DC motor (2) when the change in the motor current ($I_{Motor}$) exceeds the specific absolute value after reaching the maximum value.

9. A motor system (1) having a DC motor (2) and a device as claimed in claim 8.

* * * * *